(12) United States Patent
Fu et al.

(10) Patent No.: US 10,780,684 B2
(45) Date of Patent: Sep. 22, 2020

(54) BONDING DEVICE

(71) Applicant: SHANGHAI MICRO ELECTRONICS EQUIPMENT (GROUP) CO., LTD., Shanghai (CN)

(72) Inventors: Hui Fu, Shanghai (CN); Feixiang Shang, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 94 days.

(21) Appl. No.: 16/097,520

(22) PCT Filed: Apr. 28, 2017

(86) PCT No.: PCT/CN2017/082390
§ 371 (c)(1),
(2) Date: Oct. 29, 2018

(87) PCT Pub. No.: WO2017/186161
PCT Pub. Date: Nov. 2, 2017

(65) Prior Publication Data
US 2019/0131149 A1    May 2, 2019

(30) Foreign Application Priority Data

Apr. 29, 2016 (CN) .......................... 2016 1 0284256

(51) Int. Cl.
*B32B 37/10* (2006.01)
*B29C 65/00* (2006.01)
(Continued)

(52) U.S. Cl.
CPC ........ *B32B 37/10* (2013.01); *B29C 66/82661* (2013.01); *B30B 1/181* (2013.01);
(Continued)

(58) Field of Classification Search
CPC .. B32B 37/10; B30B 15/061; B29C 66/82661
See application file for complete search history.

(56) References Cited

U.S. PATENT DOCUMENTS

| | | | |
|---|---|---|---|
| 2003/0178150 A1* | 9/2003 | Lee | ......................... B32B 37/10 156/580 |
| 2004/0187616 A1* | 9/2004 | Watson | .................... F16J 3/048 74/18.2 |

(Continued)

FOREIGN PATENT DOCUMENTS

| | | |
|---|---|---|
| CN | 1801457 A | 7/2006 |
| CN | 101937854 A | 1/2011 |

(Continued)

*Primary Examiner* — Christopher T Schatz
(74) *Attorney, Agent, or Firm* — Muncy, Geissler, Olds & Lowe, P.C.

(57) ABSTRACT

A bonding device includes a flexible platen disposed between an upper platen assembly (9) and a transmission device and within a vacuum chamber (6). The flexible platen can expand to apply a downward pressure to the upper platen assembly (9) connected thereto. Under the effect of the pressure, the upper platen assembly (9) slowly moves downward until the upper platen assembly (9) itself and a lower platen assembly (7) respectively come into tight contact with objects to be bonded. After that, the flexible platen continues exerting the downward pressure on the upper platen assembly (9). In this way, the pressure applied by the upper platen assembly (9) to the objects to be bonded is uniform. Meanwhile, because of slow expansion of the flexible platen, the uniform pressure is applied slowly by the upper platen assembly (9).

14 Claims, 1 Drawing Sheet

(51) Int. Cl.
*B30B 15/06* (2006.01)
*H01L 21/67* (2006.01)
*H01L 21/687* (2006.01)
*B30B 1/18* (2006.01)
*B30B 5/02* (2006.01)
*H01L 21/68* (2006.01)

(52) U.S. Cl.
CPC .............. *B30B 5/02* (2013.01); *B30B 15/061* (2013.01); *H01L 21/6719* (2013.01); *H01L 21/67092* (2013.01); *H01L 21/68* (2013.01); *H01L 21/68785* (2013.01); *B29C 66/8163* (2013.01); *B29C 66/8223* (2013.01); *B29C 66/8322* (2013.01)

(56) References Cited

U.S. PATENT DOCUMENTS

| | | | |
|---|---|---|---|
| 2010/0071847 A1 | 3/2010 | Shin et al. | |
| 2011/0214809 A1 | 9/2011 | Sugiyama | |
| 2014/0318680 A1 | 10/2014 | Wada et al. | |
| 2014/0338813 A1* | 11/2014 | Ookawa | H01L 21/681 156/60 |

FOREIGN PATENT DOCUMENTS

| | | |
|---|---|---|
| CN | 101937854 A | 1/2011 |
| CN | 102456590 A | 5/2012 |
| CN | 102456598 A | 5/2012 |
| CN | 102456598 A | 5/2012 |
| CN | 202434479 U | 9/2012 |
| CN | 103489805 A | 1/2014 |
| JP | 2006156679 A | 6/2006 |
| JP | 2009212214 A | 9/2009 |
| JP | 2010055730 A | 3/2010 |
| JP | 2012099531 A | 5/2012 |
| JP | 2013089901 A | 5/2013 |
| WO | WO2010055730 A1 | 5/2020 |

* cited by examiner

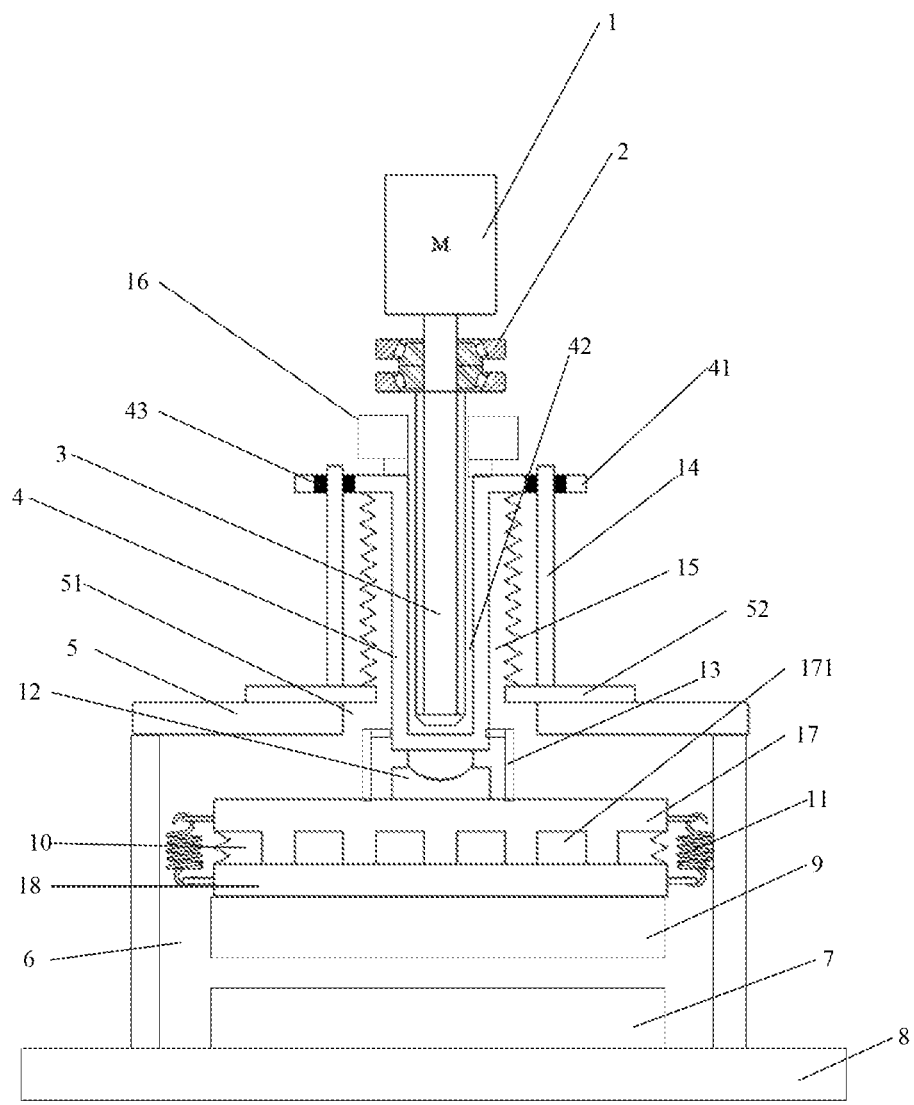

BONDING DEVICE

TECHNICAL FIELD

The present invention relates to the field of semiconductor technology and, in particular, to a bonding device.

BACKGROUND

Wafer bonding techniques are used to bond wafers of different materials together. Common bonding techniques include direct silicon/silicon bonding, direct silicon/glass bonding, metal diffusion bonding, polymer-based bonding, etc. In the semiconductor industry, bonding techniques have found their use in many segments and are regarded as one of the most important technologies in the future. Wafer bonding processes adopted in different applications typically have varying parameters, but they follow similar operating principles and all essentially include air evacuation, heating, pressure application, cooling and vacuum breaking. A complete wafer bonding process usually involves an alignment device and a bonding device. The alignment device is able to align two wafers with the aid of alignment marks thereon, insert a spacer between the wafers and fix the two wafers with respect to each other. Depending on the type of the alignment device, the process from the alignment to the fixation of the two wafers typically takes 5-8 minutes. The bonding device is capable of air evacuation, removal of the spacer, heating, pressing, cooling, vacuum breaking and bonding of the silicon wafers or wafers of different materials. The bonding of a pair of the silicon wafers or wafers performed by the bonding device typically costs 45-90 minutes.

With wafer bonding techniques being widely used in the manufacturing of micro-electro-mechanical systems (MEMSs), micro-optoelectronic systems and especially of CMOS image sensors and the recent three-dimensional (3D) chips, e.g., in through silicon via (TSV) processes, increasingly high requirements are being placed on the performance of wafer bonding devices.

Pressure application in currently existing bonding processes can be accomplished by two different approaches. One approach is a rigid bonding process, in which a pressure originating from a power source is transmitted to a platen through a main shaft, under which the wafers are bonded together. This requires the platen to have sufficient rigidity, otherwise there tends to be pressure inconsistency between central and peripheral parts of the platen. Another approach is a flexible bonding process, in which bellows are used to connect a driving device to an upper platen assembly and can thus transfer a pressure from the driving device to the upper platen assembly. Upon the upper platen assembly coming into the surface of one of the wafers to be bonded under the action of the pressure, the bellows are gradually contracted into a rigid conduit, thereby gradually increasing the pressure applied on the upper platen assembly. In this way, slow pressure application is achievable. However, when the bellows are long, after a vacuum chamber in communication with the bellows is evacuated, the bellows tend to crack over time under the action of a pressure difference between inside and outside of the bellows. What is worse is that the cracks in the bellows may be enlarged when the higher-pressure ambient air floods into the bellows therethrough.

In view of the above problems, it is necessary to further improve the conventional bonding devices.

SUMMARY OF THE INVENTION

The present invention overcomes the above problems by proposing a bonding device having a flexible platen that connects an upper platen assembly to a transmission device and can expand to enable the upper platen assembly to apply a uniform pressure to objects to be bonded.

To this end, the bonding device proposed in the present invention includes from top down: a driving device; a transmission device, in fixed connection with the driving device; an upper platen assembly, connected to the transmission device; a lower platen assembly in cooperation with the upper platen assembly, the lower platen assembly configured to support objects to be bonded that are disposed between the lower platen assembly and the upper platen assembly; and a vacuum chamber, in which the upper platen assembly and the lower platen assembly are both housed, wherein the upper platen assembly is connected to the transmission device by a flexible platen which is able to expand so as to allow the upper platen assembly to apply a uniform pressure to the objects to be bonded.

In a preferred embodiment, a rotation locking mechanism may be connected between the flexible platen and the transmission device and is configured to prevent the upper platen assembly from rotating about a central axis of the transmission device.

In a preferred embodiment, the flexible platen may include, from top down, an upper plate and a lower plate, the upper plate connected to the lower plate by an expandable member.

In a preferred embodiment, the expandable member may include lower bellows that are connected at one end to the upper plate and at the other end to the lower plate.

In a preferred embodiment, a locking mechanism for the expandable member may be further disposed between the upper plate and the lower plate and is configured for limiting expansion and contraction of the expandable member.

In a preferred embodiment, the transmission may include a main shaft fixed to a top of the flexible platen, the main shaft extending from an interior of the vacuum chamber to an exterior of the vacuum chamber and being fixedly connected to the driving device.

In a preferred embodiment, the main shaft may be fixed to the top of the flexible platen through a spherical plain thrust bearing.

In a preferred embodiment, the vacuum chamber may include a top chamber wall located in an upper portion and a bottom chamber wall located in a lower portion, and wherein the main shaft extends from the interior of the vacuum chamber through the top chamber wall to the exterior of the vacuum chamber.

In a preferred embodiment, guide shafts may be provided on the top chamber wall and distributed uniformly around the main shaft, wherein a top of the main shaft is provided with an upper flange that is diametrically greater than the main shaft, and wherein the guide shafts are slidably engaged with the upper flange so that the main shaft is moveable up and down along the guide shafts.

In a preferred embodiment, the upper flange may define circular holes corresponding to the guide shafts, wherein the guide shafts are inserted through the circular holes, and wherein the guide shafts form clearance fits with the corresponding circular holes.

In a preferred embodiment, the main shaft may define a deep bore and be connected to the driving device by a tapered shaft screw that is disposed within the deep bore, and wherein the tapered shaft screw forms a clearance fit with the deep bore.

In a preferred embodiment, a screw nut may be fixedly connected to an end face of the upper flange and has an internal thread that is engaged with the tapered shaft screw so that the screw nut is disposed over the tapered shaft screw by a threaded fit.

In a preferred embodiment, a lower flange surrounding the main shaft may be disposed on the top chamber wall, wherein the transmission device is provided with upper bellows that are fastened at one end to the upper flange and at the other end to the lower flange, and wherein each of the upper bellows has a radius smaller than a distance between a central axis of the main shaft and a central axis of any one of the guide shafts.

In a preferred embodiment, a thrust bearing may be disposed over the tapered shaft screw between the driving device and the screw nut.

In a preferred embodiment, the driving device may be a motor.

Compared to the prior art, the present invention is advantageous in providing a bonding device, including from top down: a driving device; a transmission device, in fixed connection with the driving device; an upper platen assembly, connected to the transmission device; a lower platen assembly in cooperation with the upper platen assembly, the lower platen assembly configured to support objects to be bonded that are disposed between the lower platen assembly and the upper platen assembly; and a vacuum chamber, in which the upper platen assembly and the lower platen assembly are both housed, wherein the upper platen assembly is connected to the transmission device by a flexible platen which is able to expand so as to allow the upper platen assembly to apply a uniform pressure to the objects to be bonded.

According the present invention, the flexible platen disposed between the upper platen assembly and the transmission device and within the vacuum chamber can expand lengthwise to apply a downward pressure on the upper platen assembly connected thereto. Under the effect of the pressure, the upper platen assembly slowly moves downward until the upper platen assembly itself and the lower platen assembly respectively come into tight contact with the objects to be bonded. After that, the flexible platen continues exerting the downward pressure on the upper platen assembly. In this way, the pressure applied by the upper platen assembly on the objects to be bonded is uniform. Meanwhile, because of slow expansion of the flexible platen, the uniform pressure is applied slowly by the upper platen assembly.

BRIEF DESCRIPTION OF THE DRAWINGS

The FIGURE is a cross-sectional view of a bonding device according to the present invention.

In the FIGURE, 1—a motor; 2—thrust bearing; 3—tapered shaft screw; 4—main shaft; 41—upper flange; 42—deep bore; 43—circular hole; 5—top chamber wall; 51—main-shaft hole; 52—lower flange; 6—vacuum chamber; 7—lower platen assembly; 8—bottom chamber wall; 9—upper platen assembly; 10—lower bellows; 11—bellows locking mechanism; 12—spherical plain thrust bearing; 13—rotation locking mechanism; 14—guide shaft; 15—upper bellows; 16—screw nut; 17—upper plate; 18—lower plate.

DETAILED DESCRIPTION OF PREFERRED EMBODIMENTS

These and other objects, features and advantages of the present invention will become apparent from the following detailed description of particular embodiments thereof, which is to be read in connection with the accompanying drawing.

Referring to the FIGURE, the present invention provides a bonding device, including, from the top downward:

a motor 1, serving as a bonding power source;

a transmission device in fixed connection with the motor 1 and driven by the motor 1, configured for power transmission from the motor 1 downward to other components connected thereto;

a vacuum chamber 6, defined by chamber walls including a top chamber wall 5 located in the top portion and a bottom chamber wall 8 located in the bottom portion. In general cases, the vacuum chamber 6 may be connected to a vacuum pump for evacuating air from the vacuum chamber 6 during pressure application in a bonding process performed by the bonding device in order to prevent air bubbles between the silicon wafers or wafers to be bonded, which can degrade bonding quality.

Within the vacuum chamber 6 are essentially disposed an upper platen assembly 9 and a lower platen assembly 7 for bonding the silicon wafers or wafers. The silicon wafers or wafers are placed between the upper platen assembly 9 and the lower platen assembly 7. The upper platen assembly 9 is located in the upper portion and the lower platen assembly 7 is located in the lower portion. The upper platen assembly 9 is connected to the transmission device by a flexible platen.

Specifically, the flexible platen may include an upper plate 17 and a lower plate 18 from the top downward. Both of the upper plate 17 and the lower plate 18 may be diametrically equal to or slightly greater than the upper platen assembly 9. The upper platen assembly 9 comes into contact with the lower plate 18. During pressure application, the lower plate 18 diametrically equal to or greater than the upper platen assembly 9 allows the upper platen assembly 9 to have a large enough force-bearing area to prevent a non-uniform force distribution on an upper surface of the upper platen assembly 9.

The upper plate 17 and the lower plate 18 may be both square or round in shape. In the illustrated embodiment, both of them are circular plates. The upper plate 17 may be connected to the lower plate 18 by lower bellows 10. In other words, the lower bellows 10 are connected at one end to the upper plate 17 and at the other end to the lower plate 18. The lower bellows 10 may connect the upper plate 17 and the lower plate 18 at their respective outer circumferences. The lower bellows 10 may be initially contracted and the lower bellows 10 have an air inlet (not shown) through which air can be introduced to inflate the lower bellows 10 so that the lower bellows 10 are gradually expanded longitudinally, causing the upper plate 17 and the lower plate 18 to move upward and downward, respectively. However, the upward movement is counteracted by the downward force from the transmission device. As a result, the upper plate 17 is immobilized and the lower bellows 10 longitudinally expand only downward, thereby displacing the lower plate 18 in this direction. Since the lengthwise expansion results from inflation, the lower plate 18 slowly applies a pressure to the upper platen assembly 9.

Additionally, pressure-application protrusions 171 may project from the upper plate 17 toward the lower plate 18. These pressure-application protrusions 171 may be uniformly distributed and thus define therebetween equally-partitioned spaces into which air can be introduced and pressurized during the inflation of the lower bellows 10 to drive the lower plate 18 to move downward. As a result, the pressure applied by the lower plate 18 to the upper platen assembly 9 and therethrough to the silicon wafers or wafers is uniform.

Preferably, disposed between the upper plate 17 and the lower plate 18 is a bellows locking mechanism 11. The bellows locking mechanism 11 includes of several springs that are disposed uniformly along the circumferences of the upper and lower plates 17, 18 and have the same length and the same elasticity parameters. Each of the springs is fastened at one end to one of hooks attached to a circumferential side face of the upper plate 17 and at the other end to a corresponding one of hooks attached to a circumferential side face of the lower plate 18. The springs are able to prevent the upper plate 17 from rotating relative to the lower plate 18 during operation and to avoid damage to the flexible platen, during its downward movement, as a consequence of its own lengthwise expansion due both to its inflation and evacuation of the vacuum chamber 6. Upon the lower platen assembly 7 coming into contact with one of the objects to be bonded, the springs may be deactivated. According to the present invention, the power transmission from the motor 1 to the flexible platen may be essentially accomplished by a main shaft 4 coupled to the upper plate in the flexible platen by a spherical plain thrust bearing 12 that is fastened to the upper plate 17 at one end and disposed over the main shaft 4 at the other end.

Additionally, disposed between the main shaft 4 and the upper plate may be a rotation locking mechanism 13. The rotation locking mechanism 13 includes several metal strips that are curved or not and are each fastened at one end to the main shaft 4 and at the other end to the upper plate 17. These metal strips may be disposed uniformly around the main shaft 4 and can neutralize any force tending to cause a rotation of the upper plate 17 about the main shaft 4 because of that these metal strips are fastened to both the main shaft 4 and the upper plate 17, which is unfavorable to the uniformity of the applied pressure during the rotation of the upper plate 17.

The main shaft 4 may extend from the interior of the vacuum chamber 6 to the exterior of the vacuum chamber 6. A main-shaft hole 51 is formed in the top chamber wall 5. In other words, the main shaft 4 may be inserted through the main-shaft hole 51 in the top chamber wall 5.

The main shaft 4 may have a central deep bore 42. An upper edge of the central deep bore 42 is defined by an upper flange 41. Circular holes 43 are formed in the upper flange 41. Several guide shafts 14, which are distributed uniformly around the main-shaft hole 51, may be inserted through the respective corresponding circular holes 43. Each of the guide shafts 14 may extend from the top chamber wall 5 and protrude out of an upper edge of the circular hole 43 in which it is inserted. The guide shafts 14 may form clearance fits with the circular holes 43 so that the upper flange 41 can slide up and down along the guide shafts 14.

In order to prevent the ingress of air into the vacuum chamber 6 via the main-shaft hole 51 after the vacuum chamber 6 has been evacuated, upper bellows 15 may be provided. The upper bellows 15 are connected at one end to the upper flange 41 and at the other end to a lower flange 52 on the top chamber wall 5. The lower flange 52 may be fixed around the main-shaft hole 51. The upper bellows 15 have an inner diameter that is smaller than the distance from a central axis of the main shaft 4 to that of any one of the guide shafts 14. In this way, except the upper flange 41, the remainder of the main shaft 4 is housed within the upper bellows 15. The upper bellows 15 may form, together with the vacuum chamber 6, a hermetic space, ensuring good airtightness of the vacuum chamber 6.

On an end face of the upper flange 41 of the main shaft 4, that faces toward the motor 1, may be fixed a screw nut 16. The screw nut 16 is configured to cause the main shaft 4 to move up and down. The screw nut 16 may be engaged with a tapered shaft screw 3. The tapered shaft screw 3 has a lower end received within the deep bore 42 of the main shaft 4. The tapered shaft screw 3 may have an external thread complementary to internal thread of the screw nut 16. In other words, the screw nut 16 is threadedly engaged with the tapered shaft screw 3. The tapered shaft screw 3 is fixed to the motor 1. When the tapered shaft screw 3 moves up or down under the action of the motor 1, the screw nut 16 and hence the main shaft 4 are driven to move in the same direction. During bonding, the main shaft 4 is caused to move downward, driving the flexible platen to move in the same direction from an initial position to a position for pre-bonding. The flexible platen is then inflated to enable the bonding. After that, the vacuum in the flexible platen is broken, and the flexible platen is caused to move with the main shaft 4 upward back to the initial position.

Preferably, a thrust bearing 2 is disposed between the screw nut 16 and the motor 1. The thrust bearing 2 has an outer diameter greater than an inner diameter of the screw nut 16 and thus serve as a limit stop for upward movement of the screw nut 16, which ensures that the screw nut 16 will not advance beyond a position corresponding to a maximum permissible length of the upper bellows 15 to cause damage of the upper bellows 15 or disconnection of the upper bellows 15 from the lower flange 52.

A bonding process carried out by the bonding device of the present invention will be described in detail below.

With the upper platen assembly 9 at the initial position, air is evacuated from the vacuum chamber 6, and the motor 1 causes a rotation of the tapered shaft screw 3. As a result of power transmission from the tapered shaft screw 3 to the screw nut 16 sequentially to the main shaft 4, to the flexible platen and to the upper platen assembly 9, the upper platen assembly 9 moves downward to the position for pre-bonding (a position where a bottom surface of the upper platen assembly 9 is 3 mm to 5 mm above the wafers). After heating discs respectively in the upper platen assembly 9 and the lower platen assembly 7 are heated to a desired temperature, the motor 1 causes the upper platen assembly 9 to further move downward. As a result, the bottom surface of the upper platen assembly 9 comes into contact with an upper surface of the upper wafer and applies a pressure to the lower platen assembly 7. A sensor in the lower platen assembly 7 monitors this pressure and, when it reaches a predefined value, signals this to the motor 1 to instruct the motor 1 to stop operating.

The lower bellows 10 is inflated to a pressure of 30 bar or lower and thus gradually expands longitudinally, causing the upper plate 17 and the lower plate 18 to move upward and downward, respectively. However, the upward movement is blocked when the screw nut 16 abuts against the thrust bearing 2 during upward movement of the main shaft 4 with the upper plate 17. For this reason, the upper plate 17 is immobilized, and the lower bellows 10 expand only downward, causing the lower plate 18 to drive the upper platen assembly 9 to move in this direction. The downward pressure on the lower platen assembly 7 continues even after the upper platen assembly 9 has come into contact with the upper wafer. The rotation locking mechanism 13 can prevent any rotation of the lower bellows 10 about the main shaft 4. During the downward movement of the lower bellows 10 about the main shaft 4, which may cause dislocation of the wafers. At the end of the bonding process, the vacuum in the lower bellows 10 is broken and, as a result, the pressure applied by the upper platen assembly 9 on the upper wafers decreases and finally disappears. The motor 1 then rotates the tapered shaft screw 3 to cause the upper platen assembly 9 to return to the initial position, and the bonded silicon wafers or wafers are then taken away.

In summary, in the bonding device of the present invention, the flexible platen disposed between the upper platen assembly 9 and the transmission device and within the vacuum chamber 6 can expand lengthwise to apply a downward pressure on the upper platen assembly 9 connected thereto. Under the effect of the pressure, the upper platen assembly 9 slowly moves downward until the upper platen assembly 9 itself and the lower platen assembly 7 respectively come into tight contact with the objects to be bonded. After that, the flexible platen continues exerting the downward pressure on the upper platen assembly 9. In this way, the pressure applied by the upper platen assembly 9 to the objects to be bonded is uniform. Meanwhile, because of slow expansion of the flexible platen, the uniform pressure is applied slowly by the upper platen assembly 9.

While the present invention has been described above with reference to the foregoing embodiments, it is not limited to these embodiments. It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A bonding device, comprising from top down:
   a driving device;
   a transmission device, in fixed connection with the driving device;
   an upper platen assembly, connected to the transmission device;
   a lower platen assembly in cooperation with the upper platen assembly, the lower platen assembly configured to support objects to be bonded that are disposed between the lower platen assembly and the upper platen assembly; and
   a vacuum chamber, in which the upper platen assembly and the lower platen assembly are both housed,
   wherein the upper platen assembly is connected to the transmission device by a flexible platen which is able to expand so as to allow the upper platen assembly to apply a uniform pressure to the objects to be bonded,
   wherein the transmission device comprises a main shaft fixed to a top of the flexible platen, the vacuum chamber comprising a top chamber wall, the main shaft extending from an interior of the vacuum chamber through the top chamber wall to an exterior of the vacuum chamber, wherein guide shafts are provided on the top chamber wall and distributed uniformly around the main shaft, a top of the main shaft provided with an upper flange that is diametrically greater than the main shaft, and the guide shafts slidably engaged with the upper flange so that the main shaft is moveable up and down along the guide shafts.

2. The bonding device of claim 1, wherein a rotation locking mechanism is connected between the flexible platen and the transmission device and is configured to prevent the upper platen assembly from rotating about a central axis of the transmission device.

3. The bonding device of claim 1, wherein the flexible platen comprises, an upper plate and a lower plate, the upper plate connected to the lower plate by an expandable member.

4. The bonding device of claim 3, wherein the expandable member comprises lower bellows that are connected at a first end to the upper plate and at a second end to the lower plate.

5. The bonding device of claim 3, wherein a locking mechanism of the expandable member is further disposed between the upper plate and the lower plate and is configured to limit expansion and contraction of the expandable member.

6. The bonding device of claim 1, wherein is fixedly connected to the driving device.

7. The bonding device of claim 6, wherein the main shaft is fixed to the top of the flexible platen through a spherical plain thrust bearing.

8. The bonding device of claim 6, wherein the top chamber wall is located in an upper portion of the vacuum chamber and the vacuum chamber further comprises a bottom chamber wall located in a lower portion thereof.

9. The bonding device of claim 1, wherein the upper flange defines circular holes corresponding to the guide shafts, wherein the guide shafts are inserted through the circular holes, and wherein the guide shafts form clearance fits with the corresponding circular holes.

10. The bonding device of claim 1, wherein the main shaft defines a deep bore and is connected to the driving device by a tapered shaft screw that is disposed within the deep bore, and wherein the tapered shaft screw forms a clearance fit with the deep bore.

11. The bonding device of claim 10, wherein a screw nut is fixedly connected to an end face of the upper flange and has an internal thread that is engaged with the tapered shaft screw so that the screw nut is disposed over the tapered shaft screw in threaded fit.

12. The bonding device of claim 11, wherein a lower flange surrounding the main shaft is disposed on the top chamber wall, wherein the transmission device is provided with a plurality of upper bellows that are fastened at one end to the upper flange and at the other end to the lower flange, and wherein each of the plurality of upper bellows has a radius smaller than a distance between a central axis of the main shaft and a central axis of any one of the guide shafts.

13. The bonding device of claim 11, wherein a thrust bearing is disposed over the tapered shaft screw between the driving device and the screw nut.

14. The bonding device of claim 1, wherein the driving device is a motor.

* * * * *